(12) United States Patent
Bessonov et al.

(10) Patent No.: US 10,475,941 B2
(45) Date of Patent: Nov. 12, 2019

(54) PHOTODETECTOR WITH CONDUCTIVE CHANNEL MADE FROM TWO DIMENSIONAL MATERIAL

(71) Applicant: Nokia Technologies Oy, Espoo (FI)

(72) Inventors: Alexander Bessonov, Cambridge (GB); Adam Robinson, Cambridge (GB); Darryl Cotton, Cambridge (GB); Richard White, Cambridge (GB)

(73) Assignee: NOKIA TECHNOLOGIES OY, Espoo (FI)

( * ) Notice: Subject to any disclaimer, the term of this patent is extended or adjusted under 35 U.S.C. 154(b) by 0 days.

(21) Appl. No.: 15/761,200

(22) PCT Filed: Sep. 12, 2016

(86) PCT No.: PCT/FI2016/050626
§ 371 (c)(1),
(2) Date: Mar. 19, 2018

(87) PCT Pub. No.: WO2017/051068
PCT Pub. Date: Mar. 30, 2017

(65) Prior Publication Data
US 2018/0261702 A1   Sep. 13, 2018

(30) Foreign Application Priority Data
Sep. 22, 2015   (EP) .................................. 15186234

(51) Int. Cl.
*H01L 31/02*   (2006.01)
*H01L 31/11*   (2006.01)
(Continued)

(52) U.S. Cl.
CPC ...... *H01L 31/028* (2013.01); *H01L 31/02363* (2013.01); *H01L 31/02366* (2013.01);
(Continued)

(58) Field of Classification Search
CPC ............ H01L 31/028; H01L 31/02363; H01L 31/02366; H01L 31/035209; H01L 31/035218; H01L 31/112; H01L 31/18
See application file for complete search history.

(56) References Cited

U.S. PATENT DOCUMENTS

| 4,663,188 A | 5/1987 | Kane |
| 6,087,197 A * | 7/2000 | Eriguchi ................ B82Y 10/00 |
| | | 257/E21.235 |

(Continued)

FOREIGN PATENT DOCUMENTS

| WO | 00/28603 | 5/2000 |
| WO | 2011/160130 | 12/2011 |

OTHER PUBLICATIONS

International Search Report and Written Opinion received for corresponding Patent Cooperation Treaty Application No. PCT/FI2016/050626, dated Dec. 9, 2016, 16 pages.

(Continued)

*Primary Examiner* — Ida M Soward
(74) *Attorney, Agent, or Firm* — Alston & Bird LLP

(57) ABSTRACT

A photodetector has a two dimensional conductive channel and a quantum dot layer configured to generate charge on exposure to incident electromagnetic radiation. The surface texture of the quantum dot layer has texturing to provide surface roughness which increases the amount of electromagnetic radiation absorbed in the quantum dot layer in comparison to a photodetector having a flat (non-textured) incident electromagnetic radiation surface.

19 Claims, 7 Drawing Sheets

(51) Int. Cl.
  *H01L 31/18* (2006.01)
  *H01L 31/028* (2006.01)
  *H01L 31/0236* (2006.01)
  *H01L 31/0352* (2006.01)
  *H01L 31/112* (2006.01)

(52) U.S. Cl.
  CPC .............. *H01L 31/035209* (2013.01); *H01L 31/035218* (2013.01); *H01L 31/112* (2013.01); *H01L 31/18* (2013.01); *Y02E 10/547* (2013.01)

(56) References Cited

U.S. PATENT DOCUMENTS

| | | | |
|---|---|---|---|
| 7,652,310 B2* | 1/2010 | Sugaya | B82Y 10/00 257/192 |
| 7,951,638 B1* | 5/2011 | Yang | H01L 31/0236 136/250 |
| 8,212,250 B2 | 7/2012 | Forbes | |
| 8,434,924 B1* | 5/2013 | Hamburgen | G02B 6/0068 362/231 |
| 8,823,077 B2* | 9/2014 | Lee | B82Y 10/00 257/322 |
| 9,166,363 B2* | 10/2015 | Jain | B82Y 20/00 |
| 9,246,113 B2* | 1/2016 | Chan | H01L 51/0562 |
| 9,287,412 B2* | 3/2016 | Jain | B82Y 10/00 |
| 9,331,181 B2* | 5/2016 | Lee | H01L 29/66825 |
| 9,331,209 B2* | 5/2016 | Jain | B82Y 10/00 |
| 9,592,532 B2* | 3/2017 | Malshe | B05D 3/00 |
| 2002/0167002 A1* | 11/2002 | Chae | B82Y 10/00 257/20 |
| 2005/0242364 A1 | 11/2005 | Moustakas et al. | |
| 2006/0052947 A1* | 3/2006 | Hu | B82Y 10/00 702/20 |
| 2006/0071205 A1* | 4/2006 | Nauka | B82Y 10/00 257/20 |
| 2008/0017863 A1* | 1/2008 | Chen | B82Y 10/00 257/69 |
| 2008/0026532 A1* | 1/2008 | Duan | B82Y 10/00 438/287 |
| 2010/0163843 A1* | 7/2010 | Choi | B82Y 10/00 257/24 |
| 2010/0206362 A1 | 8/2010 | Flood | |
| 2011/0217544 A1 | 9/2011 | Young et al. | |
| 2011/0315204 A1 | 12/2011 | Gleason et al. | |
| 2012/0048368 A1 | 3/2012 | Chaudhary et al. | |
| 2012/0118365 A1 | 5/2012 | Bessonov et al. | |
| 2013/0026441 A1 | 1/2013 | White | |
| 2014/0001533 A1* | 1/2014 | Purayath | H01L 29/66825 257/321 |

OTHER PUBLICATIONS

Gerasimos Konstatatos et al. "Hybrid graphene-quantum dot phototransistors with ultrahigh gain", Nature Nanotechnology, vol. 7, No. 6, Jan. 1, 2012, pp. 363-368.
"Light Trapping", PV Education.Org, Retrieved on Jul. 9, 2018, Webpage available at : https://www.pveducation.org/pvcdrom/design-of-silicon-cells/light-trapping.
Haug et al., "Light Management in Thin Film Silicon Solar Cells", Energy & Environmental Science, vol. 8, No. 3, Jan. 21, 2015, pp. 824-837.
Jovanov et al., "Light Trapping in Periodically Textured Amorphous Silicon Thin Film Solar Cells Using Realistic Interface Morphologies", Optics Express, vol. 21, No. 104, May 22, 2013, pp. A595-A606.
Brongersma et al., "Light Management for Photovoltaics Using High-Index Nanostructures", Nature Materials, vol. 13, Apr. 22, 2014, pp. 451-460.
Dai et al., "Effective Light Trapping Enhancement by Plasmonic Ag Nanoparticles on Silicon Pyramid Surface", Optics Express, vol. 20, No. 104, Jun. 6, 2012, pp. A502-A509.
Labelle et al., "Conformal Fabrication of Colloidal Quantum Dot Solids for Optically Enhanced Photovoltaics", ACS Nano, vol. 9, No. 5, 2015, pp. 5447-5453.
Huang et al., "Microstructured Silicon Photodetector", Applied Physics Letters, vol. 89, No. 3, Jul. 20, 2006, 3 pages.
Zhang et al., "Strong Infrared Absorber: Surface-Microstructured Au Film Replicated From Black Silicon", Optics Express, vol. 19, No. 21, Oct. 3, 2011, pp. 20462-20467.
"More Efficient Polymer Solar Cells Fabricated", Science Daily, Retrieved on Jul. 9, 2018, Webpage available at 7: https://www.sciencedaily.com/releases/2010/12/101202181128.htm.
"Novel Crumpling Method Takes Flat Graphene From 2-D to 3-D", Scicasts, Retrieved on Jul. 9, 2018, Webpage available at :https://scicasts.com/channels/material-science/2076-graphene/9002-novel-crumpling-method-takes-flat-graphene-from-2-d-to-3-d/.
Liu et al., "Triangular Graphene Grain Growth on Cube-Textured Cu Substrates", Advanced Functional Materials, vol. 21, No. 20, Oct. 21, 2011, pp. 3868-3874.
Extended European Search Report received for corresponding European Patent Application No. 15186234.9, dated Apr. 12, 2016, 11 pages.
Office action received for corresponding Vietnam Patent Application No. 1-2018-01713, dated May 31, 2018, 1 page of office action and 1 page of translation available.

* cited by examiner

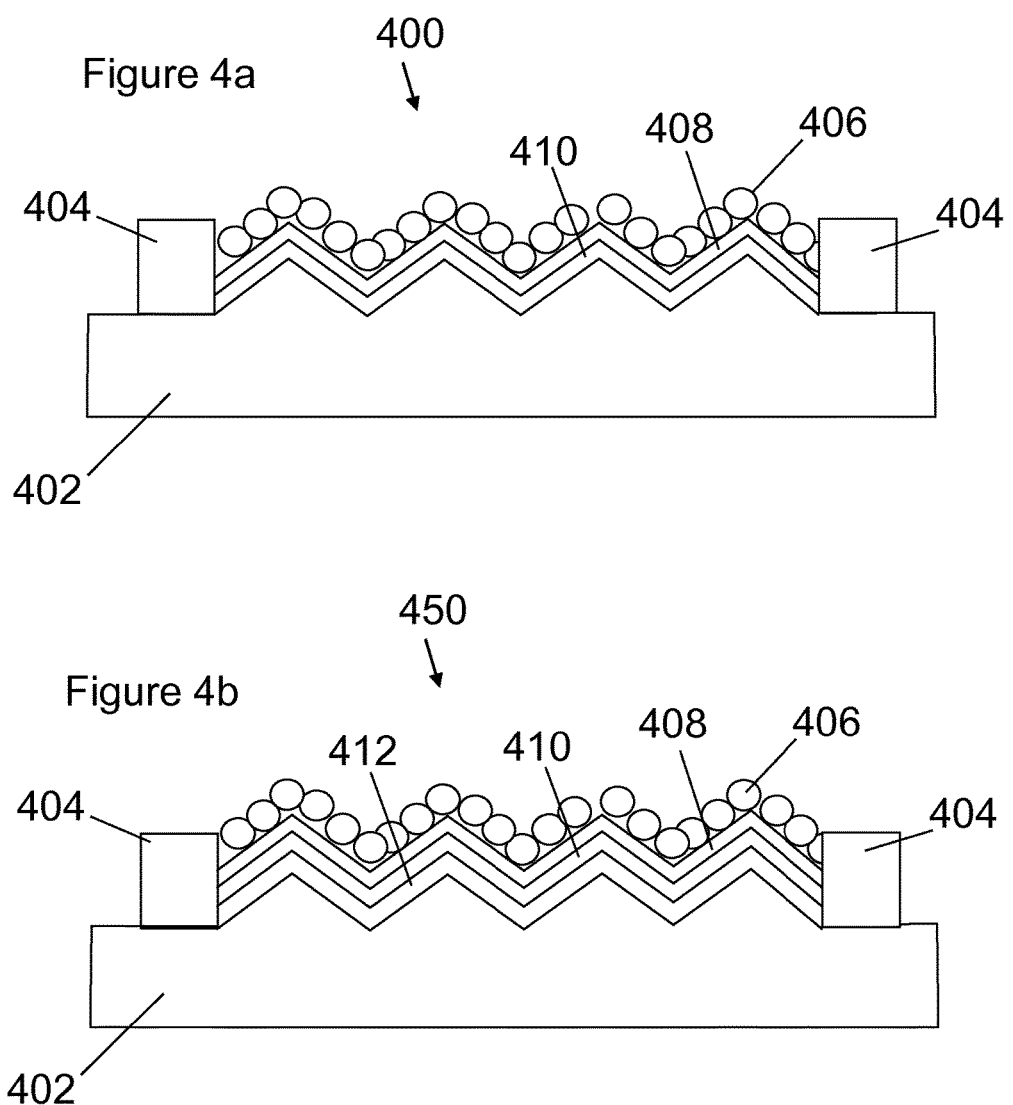

PHOTODETECTOR WITH CONDUCTIVE CHANNEL MADE FROM TWO DIMENSIONAL MATERIAL

RELATED APPLICATION

This application was originally filed as PCT Application No. PCT/FI2016/050626 filed Sep. 12, 2016 which claims priority benefit from EP Application No. 15186234.9 filed Sep. 22, 2015.

TECHNICAL FIELD

The present disclosure relates to the field of two-dimensional materials and electronic devices such as photodetectors and field effect transistors (FETs) comprising two-dimensional materials.

Certain aspects/embodiments may relate to sensing (e.g. optical sensing) and imaging for healthcare, automotive or wearable applications. Other disclosed example aspects/embodiments relate to portable electronic devices, in particular, so-called hand-portable electronic devices which may be hand-held in use (although they may be placed in a cradle in use). Such hand-portable electronic devices include so-called Personal Digital Assistants (PDAs) and tablet PCs.

The portable electronic devices/apparatus according to one or more disclosed example aspects/embodiments may provide one or more audio/text/video communication functions (e.g. tele-communication, video-communication, and/or text transmission, Short Message Service (SMS)/Multimedia Message Service (MMS)/emailing functions, interactive/non-interactive viewing functions (e.g. web-browsing, navigation, TV/program viewing functions), music recording/playing functions (e.g. MP3 or other format and/or (FM/AM) radio broadcast recording/playing), downloading/sending of data functions, image capture function (e.g. using a (e.g. in-built) digital camera), and gaming functions.

BACKGROUND

Electronic apparatus may be fabricated using two-dimensional materials, such as graphene.

The listing or discussion of a prior-published document or any background in this specification should not necessarily be taken as an acknowledgement that the document or background is part of the state of the art or is common general knowledge.

SUMMARY

According to a first aspect, there is provided an apparatus comprising
 a two dimensional conductive channel with source and drain electrodes configured to enable a flow of electrical current through the two dimensional conductive channel; and
 a quantum dot layer overlying the two dimensional conductive channel, the quantum dot layer configured to generate charge on exposure to incident electromagnetic radiation, the generated charge producing an electric field which causes a change in electrical current passing through the underlying two dimensional conductive channel, the change in electrical current indicative of one or more of the presence and magnitude of the incident electromagnetic radiation;
 wherein the quantum dot layer is configured to have an incident electromagnetic radiation surface which has a texturing comprising undulations in the surface to provide a surface roughness with an average peak amplitude of the order of between 10 nm and 300 nm.

Such a range of average peak amplitudes may allow the apparatus to detect electromagnetic radiation having a wavelength of between about 200 nm to about 1200 nm.

The average peak amplitude may be of the order of between various combinations of 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 mn, 95 nm, 100 nm, 105 nm, 110 nm, 115 nm, 120 nm, 125 nm, 130 nm, 135 nm, 140 nm, 145 nm, 150 nm, and 155 nm, 160 nm, 165 nm, 170 nm, 175 nm, 180 nm, 185 nm, 190 nm, 195 nm, 200 nm, 205 nm, 210 nm, 215 nm, 220 nm, 225 nm, 230 nm, 235 nm, 240 nm, 245 nm, 250 nm, 255 nm, 260 nm, 265 nm, 270 nm, 275 nm, 280 nm, 285 nm, 290 nm, 295 nm, and 300 nm. That, is, the average peak amplitude may be of the order of between 10 nm to 150 nm, and 155 nm to 300 nm (for example, between 45 nm and 270 nm, or between 80 nm and 250 nm).

The surface roughness may have an average peak amplitude of the order of between 10 nm and 100 nm. Such a range of average peak amplitudes may allow the apparatus to detect electromagnetic radiation in the visible light range (i.e. electromagnetic radiation having a wavelength of between about 400 nm to about 800 nm.)

The quantum dot layer may be configured to have an incident electromagnetic radiation surface which has a texturing comprising undulations in the surface to provide a surface roughness with an average peak separation of the order of between 50 nm and 2000 nm.

Such a range of average peak separation may allow the apparatus to detect electromagnetic radiation having a wavelength of between about 200 nm to about 1200 nm.

The surface roughness may have an average peak separation of the order of between 50 nm and 800 nm. Such a range of average peak separation may allow the apparatus to detect electromagnetic radiation in the visible light range (i.e. electromagnetic radiation having a wavelength of between about 400 nm to about 800 nm.)

Accordingly, the textured incident electromagnetic radiation surface may be configured to reduce reflection of incident electromagnetic radiation compared with a non-textured incident electromagnetic radiation surface.

The surface roughness may be provided by one or more of:
 the quantum dot layer conforming to an underlying surface texture provided to the two dimensional conductive channel; and
 the quantum dot layer itself comprising the surface roughness such that the incident electromagnetic radiation surface is at least independent of any underlying surface texture provided to the two dimensional conductive channel.

The surface roughness may be provided by one or more of:
 the quantum dot layer having a variable thickness providing the surface roughness with an average peak amplitude of the order of between 10 nm and 300 nm; and
 the underlying surface texture provided to the two dimensional conductive channel providing the surface roughness with an average peak amplitude of the order of between 10 nm and 300 nm.

The surface roughness may be provided by one or more of:
- the quantum dot layer having a variable thickness providing the surface roughness with an average peak separation of the order of between 50 nm and 2000 nm; and
- the underlying surface texture provided to the two dimensional conductive channel providing the surface roughness with an average peak separation of the order of between 50 nm and 2000 nm.

The quantum dot layer may have a layer thickness of the order of between 10 nm and 500 nm. The quantum dot layer may have a layer thickness of the order of approximately 100 nm. The layer thickness may be taken to be the thickness of the quantum dot layer at a particular point normally through the quantum dot layer, normal to at least the incident electromagnetic radiation surface.

The two dimensional conductive channel may comprise graphene.

The quantum dot layer may comprise a plurality of quantum dots formed from one or more of: PbS, CdSe, CdS, PbSe, ZnO, ZnS, CZTS, $Cu_2S$, $Bi_2S_3$, $Ag_2S$, HgTe, CdSe, CdHgTe, InAs, InSb, PbTe, CdTe, InP, ZnSe, CdSeTe, ZnSeS, ZnHgSe, ZnSeTeGe and ClS. The quantum dot layer/film may be deposited from colloidal quantum dots (or may comprise colloidal quantum dots). It will be appreciated that colloidal quantum dots are considered to be quantum dots dispersed/suspended in solution so that they do not settle to the bottom of a container.

The undulations in the incident electromagnetic radiation surface may comprise one or more of: periodic undulations, rounded pyramidal undulations, pyramidal undulations, U-shaped undulations, hemispherical undulations, and irregular undulations.

The apparatus may further comprise:
- a dielectric layer underlying the two dimensional conductive channel; and
- a gate layer underlying the dielectric layer, such that the two dimensional conductive channel is located between the dielectric layer and the quantum dot layer.

The apparatus may be one or more of: an electronic device, a portable electronic device, a portable telecommunications device, a mobile phone, a personal digital assistant, a tablet computer, a desktop computer, a laptop computer, a server, a smartphone, a smartwatch, smart eyewear, a camera, a sensor, an image sensor, a photodetector, a phototransistor, a flat panel array comprising a plurality of detection pixels, and a module for one or more of the same.

According to a further aspect, there is provided a method comprising:
- providing a two dimensional conductive channel;
- providing source and drain electrodes configured to enable a flow of electrical current through the two dimensional conductive channel; and
- providing a quantum dot layer overlying the two dimensional conductive channel, the quantum dot layer configured to generate charge on exposure to incident electromagnetic radiation, the generated charge producing an electric field which causes a change in electrical current passing through the underlying two dimensional conductive channel, the change in electrical current indicative of one or more of the presence and magnitude of the incident electromagnetic radiation;
- wherein the quantum dot layer is configured to have an incident electromagnetic radiation surface which has a texturing comprising undulations in the surface to provide a surface roughness with an average peak amplitude of the order of between 10 nm and 300 nm.

Providing the quantum dot layer may comprise one or more of:
- depositing a layer of quantum dots so that it conforms with an underlying surface texture provided to the two dimensional conductive channel; and
- depositing a layer of quantum dots such that the layer of quantum dots itself has the surface roughness such that the incident electromagnetic radiation surface which is at least independent of any underlying surface texture provided to the two dimensional conductive channel.

Providing the quantum dot layer may comprise depositing the quantum dot layer as a wet layer, and imprinting the wet quantum dot layer with a textured mould to provide the incident electromagnetic radiation surface of the quantum dot layer with the surface roughness. The mould face which engages with the wet layer may have a textured surface with an average peak amplitude of the order of between 10 nm and 300 nm, or appropriate sub-ranges thereof, as discussed earlier in relation to the average peak amplitude of the textured incident electromagnetic radiation surface of the quantum dot layer.

The method may comprise:
- texturing a substrate surface;
- depositing the two dimensional conductive channel over the textured substrate surface so that it conforms to the underlying textured substrate surface to provide a two dimensional textured conductive channel surface having texturing comprising undulations in the surface; and
- depositing a layer of quantum dots on the textured two dimensional conductive channel such that the quantum dot layer conforms to the textured surface to provide the surface roughness with an average peak amplitude of the order of between 10 nm and 300 nm.

The substrate surface texturing may have an average peak amplitude of the order of between 10 nm and 300 nm, or appropriate sub-ranges thereof, as discussed earlier in relation to the average peak amplitude of the textured incident electromagnetic radiation surface of the quantum dot layer.

The term "conforms" may be taken to mean that, for example, the two dimensional conductive channel substantially follows the contours of the underlying textured surface of the substrate, and/or, for example, the quantum dot layer substantially follows the contours of the underlying textured two dimensional conductive channel.

The substrate may comprise a polymer; and the substrate surface may be textured by depositing the substrate as a liquid and imprinting the liquid substrate with a mould to form the textured substrate surface.

The substrate may comprise silicon and/or silicon dioxide; and the substrate surface may be textured by wet etching, dry etching, electron-beam lithography, focused ion beam (FIB) lithography, or other suitable technique.

The method may comprise:
- depositing a metallic seed layer onto the textured substrate so that it conforms to the textured substrate; and
- depositing the two dimensional conductive channel onto the textured metallic seed layer using chemical vapour deposition so that it conforms to the underlying textured metallic seed layer to provide the surface roughness to the incident electromagnetic radiation surface.

The method may comprise:
- providing a sacrificial substrate layer having a textured sacrificial substrate surface;

depositing the two dimensional conductive channel on the textured sacrificial substrate surface so that it conforms to the textured sacrificial substrate surface;

depositing a polymer layer onto the two dimensional conductive channel; and releasing the sacrificial substrate layer to expose the two dimensional conductive channel having texturing comprising undulations in the surface to provide the surface roughness to the incident electromagnetic radiation surface.

The method may comprise depositing electrodes on the two dimensional conductive channel to allow for the flow of charge through the two dimensional conductive channel between the deposited electrodes.

The method may comprise:

depositing a gate layer prior to depositing a dielectric layer; and depositing the dielectric layer prior to depositing the two dimensional conductive channel; such that the two dimensional conductive channel is located between the dielectric layer and the quantum dot layer.

The steps of any method disclosed herein do not have to be performed in the exact order disclosed, unless explicitly stated or understood by the skilled person.

According to a further aspect, there is provided a computer readable medium comprising computer program code stored thereon, the computer readable medium and computer program code being configured to, when run on at least one processor, perform any of the methods disclosed herein.

Corresponding computer programs (which may or may not be recorded on a carrier) for implementing one or more of the methods disclosed herein are also within the present disclosure and encompassed by one or more of the described example embodiments.

Throughout the present specification, descriptors relating to relative orientation and position, such as "top", "bottom", "left", "right", "above" and "below", as well as any adjective and adverb derivatives thereof, are used in the sense of the orientation of the apparatus as presented in the drawings. However, such descriptors are not intended to be in any way limiting to an intended use of the described examples.

References to "light" throughout this specification may be understood to encompass the visible light wavelength range of the electromagnetic spectrum as well as other wavelength ranges of the electromagnetic spectrum; similarly references to the "electromagnetic spectrum" of course include the visible light wavelength range as well as other wavelength ranges (e.g., infra-red, ultra-violet, and others).

References to "layer" throughout this specification are intended to encompass a single layer in the sense of a monolayer (e.g., a monolayer of graphene), a layer in the sense of a multilayer comprising multiple layers of substantially a single material (e.g., a multilayer of copper several atoms thick, a polymer layer of the order of 100 nm, 1 μm or 1 mm) and also a multilayer in the sense of a functional layer component comprising more than one layer material (e.g., a substrate layer comprising a plurality of layers of different materials), and also a combination of these.

The present disclosure includes one or more corresponding aspects, example embodiments or features in isolation or in various combinations whether or not specifically stated (including claimed) in that combination or in isolation. Corresponding means and corresponding functional units for performing one or more of the discussed functions are also within the present disclosure.

The above summary is intended to be merely exemplary and non-limiting.

BRIEF DESCRIPTION OF THE FIGURES

A description is now given, by way of example only, with reference to the accompanying drawings, in which:—

FIG. 4a illustrates an example photodetector apparatus according to examples described herein;

FIG. 4b illustrates an example field effect transistor apparatus according to examples described herein;

DESCRIPTION OF SPECIFIC ASPECTS/EMBODIMENTS

One or more disclosed embodiments of the present apparatus relate to photodetectors. A photodetector is a device/apparatus which can operate to detect/sense the presence of visible light or other electromagnetic energy/radiation.

A common problem of photosensitive devices is that light approaching the surface may be absorbed weakly which makes absorption enhancement desirable to obtain a feasible device. Photosensitive devices such as photodetectors require a promotion of the response of light from a limited wavelength range (e.g. visible light). It may therefore be desirable to enhance light absorption in photosensitive devices such as photodetectors.

Figure 1:
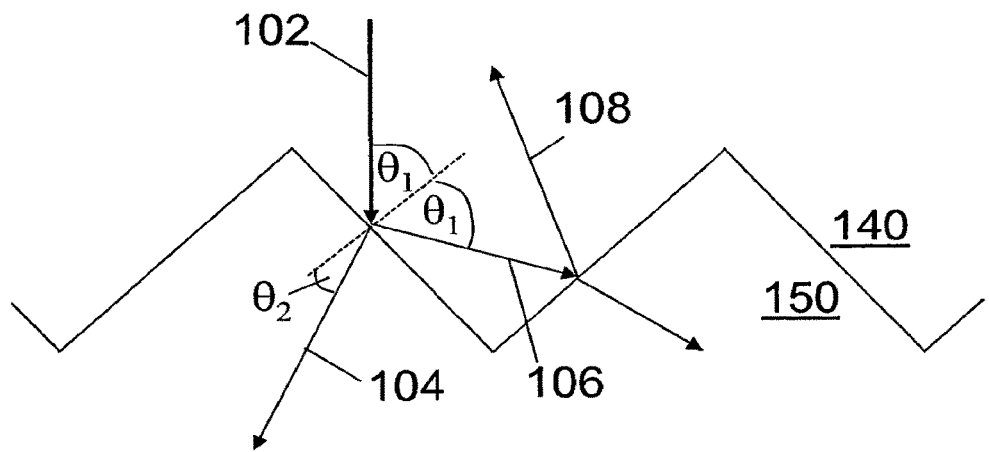
FIG. 1 illustrates light interacting with a surface.

Surface texturing may provide a way of reducing the reflection of light incident on the surface of a photosensitive device compared with reflection from a flat non-textured surface, and increasing the probability of light scattering inside the structure of the device. Any "roughening" of the surface may reduce light reflection by increasing the chances of reflected light bouncing back onto the surface, rather than out to the surroundings. This principle is illustrated in FIG. 1.

Incident light 102 may be trapped 104 inside a material 150 (rather than reflecting off 106, 108 the material's surface) by changing the angle $\theta_1$ at which light 102 is incident on and travels in the material 150. The angle at which light is refracted into a material 150 is $n_1 \sin \theta_1 = n_2 \sin \theta_2$ according to Snell's Law, where $\theta_1$ and $\theta_2$ are the angles for the light incident on the interface relative to the normal plane, and $n_1$ and $n_2$ are the refractive indices of the interface media 140, 150.

By rearranging Snell's law, the angle at which light enters the material 150 on which it is incident (the angle of refracted light) can be calculated by $\theta_2 = \sin^{-1}(n_2 \sin \theta_1 / n_1)$. The amount of light reflected 106, 108 at an interface can be calculated from the Fresnel reflection formula. For light polarised parallel to the surface, for light polarised perpendicular to the surface, and for unpolarised light, the amount of reflected light R∥, R⊥ and RT respectively, is:

$$R\| = \tan^2(\theta_1 - \theta_2)/\tan^2(\theta_1 + \theta_2)$$

$$R\perp = \sin^2(\theta_1 - \theta_2)/\sin^2(\theta_1 + \theta_2)$$

$$RT = (R\perp + R\|)/2$$

Increasing the amount of light trapped, for example, in a photodetector, may be advantageous to increase the efficiency of the photodetector.

Fabricating a photodetector as an apparatus comprising quantum dots overlaying a two-dimensional conductor so that the surface of the apparatus open for light/electromagnetic radiation exposure has a texture to increase the amount of light/electromagnetic radiation absorbed compared with a flat (non-textured) apparatus may be performed according to examples described herein.

Examples described herein relate to an apparatus comprising: a two dimensional conductive channel with source and drain electrodes configured to enable a flow of electrical current through the two dimensional conductive channel; and a quantum dot layer overlying the two dimensional conductive channel, the quantum dot layer configured to generate charge on exposure to incident electromagnetic radiation, the generated charge producing an electric field which causes a change in electrical current passing through the underlying two dimensional conductive channel, the change in electrical current indicative of one or more of the presence and magnitude of the incident electromagnetic radiation; wherein the quantum dot layer is configured to have an incident electromagnetic radiation surface which has a texturing comprising undulations in the surface to provide a surface roughness with an average peak amplitude of the order of between 10 nm and 300 nm.

The average peak amplitude may be taken to mean the arithmetic mean value of peak amplitudes, for example for a sample area of the textured surface. Similarly the average peak separation may be taken to mean the arithmetic mean of peak separations for a sample area of the textured surface (for example, as measured in one or more directions over the surface). It may be understood that an "outlier" feature, such as a scratch in the surface, is not taken to contribute to the average peak amplitude and/or average peak separation.

Figure 2:
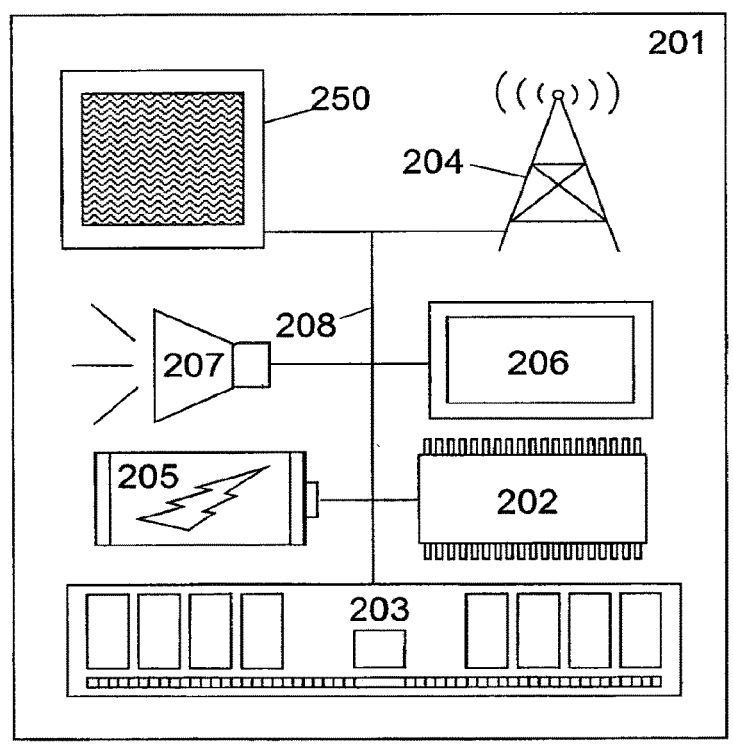
FIG. 2 illustrates schematically an apparatus according to examples described herein.

FIG. 2 shows an example apparatus 201 comprising a component apparatus 250 as described herein. The apparatus 201 may be one or more of: an electronic device, a portable electronic device, a portable telecommunications device, a mobile phone, a personal digital assistant, a tablet computer, a desktop computer, a laptop computer, a server, a smartphone, a smartwatch, smart eyewear, a camera, a sensor, an image sensor, a photodetector, a phototransistor, a flat panel array comprising a plurality of detection pixels, and a module for one or more of the same. In certain examples, the apparatus may comprise a memory 203, processor 202 and component apparatus 250.

In this example, the apparatus 201 comprises a processor 202, a memory 203, a transceiver 204, a power supply 205, a component apparatus 250, and may comprise an electronic display 206 and a loudspeaker 207, which are electrically connected to one another by a data bus 208.

The processor 202 is configured for general operation of the apparatus 201 by providing signalling to, and receiving signalling from, the other components to manage their operation. The memory 203 is configured to store computer program code configured to perform, control or enable operation of the apparatus 201. The memory 203 may also be configured to store settings for the other components. The processor 202 may access the memory 203 to retrieve the component settings in order to manage the operation of the other components. The processor 202 may be a microprocessor, including an Application Specific Integrated Circuit (ASIC). The memory 203 may comprise a temporary storage medium such as a volatile random access memory, and/or may comprise a permanent storage medium such as a hard disk drive, a flash memory, or a non-volatile random access memory. The power supply 205 is configured to provide the other components with electrical power to enable their functionality.

Certain examples may comprise a transceiver 204, and others not. In the former examples, the transceiver 204 may be configured to transmit data to, and/or receive data from, other apparatus/devices. Certain examples may comprise an electronic display 206. In such examples, the electronic display 206 may be include LED, e-ink, or LCD display, and be configured to display visual content. Similarly, certain examples may comprise a loudspeaker 207; and in such examples, the loudspeaker 207 may be configured to output audio content which is stored on or received by the apparatus 201. In other examples, the display 206, loudspeaker 207 and any user interface components may be remote to, but in communication with, the apparatus 201 rather than forming part of the apparatus 201. Further, in other examples, the power supply 205 may be housed separately from the apparatus 201, and may be mains power.

The component apparatus 250 may be considered to be an electronic component and may be configured to operate as a photodiode, sensor, or field effect transistor (FET), for example. The component apparatus 250 comprises, as described in more detail below, a two dimensional conductive channel with source and drain electrodes configured to enable a flow of electrical current through the two dimensional conductive channel; and a quantum dot layer overlying the two dimensional conductive channel, the quantum dot layer configured to generate charge on exposure to incident electromagnetic radiation, the generated charge producing an electric field which causes a change in electrical current passing through the underlying two dimensional conductive channel, the change in electrical current indicative of one or more of the presence and magnitude of the incident electromagnetic radiation; wherein the quantum dot layer is configured to have an incident electromagnetic radiation surface which has a texturing comprising undulations in the surface to provide an surface roughness with an average peak amplitude of the order of between 10 nm and 300 nm.

In general, the textured incident electromagnetic radiation surface of the apparatus 250 may be configured to reduce reflection of incident electromagnetic radiation compared with a non-textured incident electromagnetic radiation surface. This may be achieved by increasing the amount of light which is absorbed by the apparatus, for example, by providing an incident electromagnetic radiation surface having a textured geometry which increases the number of times that reflected electromagnetic radiation hits the incident electromagnetic radiation surface, thereby increasing the chance that the light is absorbed. For example, with reference to FIG. 1, the reflected electromagnetic radiation 106 which was not absorbed the first time the incident electromagnetic radiation 102 hit the surface is (partially) absorbed the second time it hits the surface, with a reflected proportion 108. Such absorption of reflected electromagnetic radiation would not occur if the incident radiation 102 hit a flat surface.

Figure 3A:
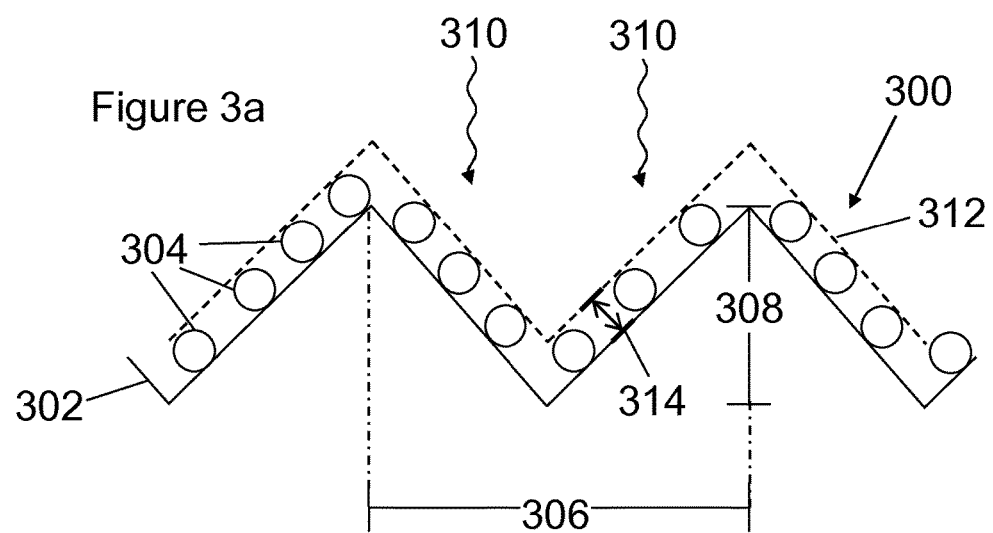
FIG. 3a illustrates an apparatus and dimensions thereof according to examples described herein.

The example apparatus 300 illustrated in FIG. 3a comprises a two dimensional conductive channel 302 which may be provided with source and drain electrodes (not shown) configured to enable a flow of electrical current through the two dimensional conductive channel. Also shown is a quantum dot layer 304 overlying the two dimensional conductive channel 302. The quantum dot layer 304 is configured to generate charge on exposure to incident electromagnetic radiation 310. The generated charge produces an electric field which causes a change in electrical current passing through the underlying two dimensional conductive channel 302. The change in electrical current is indicative of one or more of the presence and magnitude of the incident electromagnetic radiation 310.

The quantum dot layer 304 is configured to have an incident electromagnetic radiation surface 312 (that is, the surface 312 which is exposed to incident electromagnetic radiation 310, opposite to the surface in contact with the two dimensional conductive channel 302) which has a texturing comprising undulations in the surface. The texturing of the incident electromagnetic radiation surface 312 provides a surface roughness with an average peak amplitude 308 of the order of between 10 nm and 300 nm.

The dimensions of the incident electromagnetic radiation surface 312 may be tuned to particular wavelengths of incident electromagnetic radiation. For example, a surface roughness with an average peak amplitude 308 of the order of between 10 nm and 300 nm may allow the apparatus 300 to detect incident electromagnetic radiation 310 having a wavelength of between about 200 nm to about 1200 nm.

In some examples, the surface roughness may have an average peak amplitude 308 of the order of between 10 nm and 100 nm. Such a range of average peak amplitudes 308 may allow the apparatus 300 to detect incident electromagnetic radiation 310 in the visible light range (i.e. electromagnetic radiation having a wavelength of between about 400 nm to about 800 nm.)

As well as the average peak amplitudes 308 being tunable to a particular wavelength of incident electromagnetic radiation, the average peak separations 306 may also be tuned to a particular wavelength of incident electromagnetic radiation 310. For example, the quantum dot layer 304 may be configured to have an incident electromagnetic radiation surface 312 which has a texturing comprising undulations in the surface to provide a surface roughness with an average peak separation 306 of the order of between 50 nm and 2000 nm. Such a range of average peak separation 306 may allow the apparatus 300 to detect electromagnetic radiation 310 having a wavelength of between about 200 nm to about 1200 nm.

In some examples, the surface roughness may have an average peak separation 306 of the order of between 50 nm and 800 nm. Such a range of average peak separation 306 may allow the apparatus to detect electromagnetic radiation 310 in the visible light range (i.e. electromagnetic radiation 310 having a wavelength of between about 400 nm to about 800 nm.)

In this example, the surface roughness is provided by the quantum dot layer 304 conforming to an underlying surface texture provided to the two dimensional conductive channel 302.

The quantum dot layer 304 may have a layer thickness 314 of the order of between 10 nm and 500 nm. The quantum dot layer 304 may have a layer thickness 314 of the order of approximately 100 nm. Such a thickness 314 is advantageous as this provides a quantum dot layer 304 which is thick enough that the majority of quantum dots are available to actively participate in absorbing the incident electromagnetic radiation 310, while also being thin enough that the majority of quantum dots are in close enough proximity to the underlying two dimensional conductive channel to transfer charge created due to electromagnetic radiation absorption to the channel layer 302. The layer thickness 314 may be taken to be the thickness of the quantum dot layer 304 at a particular point normally through the quantum dot layer 304, normal to at least the incident electromagnetic radiation surface 312.

The quantum dot layer may comprise a plurality of quantum dots formed from one or more of: PbS, CdSe, CdS, PbSe, ZnO, ZnS, CZTS, $Cu_2S$, $Bi_2S_3$, $Ag_2S$, HgTe, CdSe, CdHgTe, InAs, InSb, PbTe, CdTe, InP, ZnSe, CdSeTe, ZnSeS, ZnHgSe, ZnSeTe Ge and ClS. Practically, such compounds would ordinarily be in colloidal form for deposition.

The two dimensional conductive channel in this and other examples may comprise one or more graphene layers, or may be one or more graphene layers. A single graphene layer is typically of the order ranging from 0.35 nm to 1 nm (i.e. approximately one carbon atom diameter) thick. In other examples the two dimensional conductive channel may be selected from the group of graphene-like materials such as phosphorene, germanen, etc., or the group of transition metal dichalcogenides (TMD): $WX_2$, $MoX_2$, $ScX_2$, $TiX_2$, $HfX_2$, $ZrX_2$, $VX_2$, $CrX_2$, $MnX_2$, $FeX_2$, $CoX_2$, $NiX_2$, $NbX_2$, $TcX_2$, $ReX_2$, $PdX_2$ and $PtX_2$ wherein "X" may be S, Se or Te. All of the above materials may be provided as 2-D materials or few-layer materials, or their combination. Although ordinarily a two-dimensional material is considered to have a maximum thickness of 1 nm (consistent with a single layer of atoms), in the context of the present disclosure it includes this understanding as well, in certain embodiments, it encompasses a few atomic layers, including 1-10 atomic layers/1-10 nm thick layers. This, the understanding has been expanded to include low-dimensional materials as well, in certain embodiments.

A photodetector may be fabricated in this way, namely comprising a layer of quantum dots at the surface configured to be exposed to light/electromagnetic radiation. Quantum dots comprising, for example, PbS and CdS may only partially absorb visible light with an external quantum efficiency (EQE) of around 10%-30%. Quantum dots made from these materials may also be able to absorb light over a broad spectrum, and therefore it may be challenging to use them in fabricating highly energy selective photodetectors. By texturing the incident electromagnetic radiation surface using particular surface undulation dimensions, the sensitivity to a particular wavelength range of incident electromagnetic radiation may be achieved and may therefore increase the responsivity of the apparatus.

Such an apparatus with a textured surface may enable enhanced light scattering within the apparatus and enable enhanced light trapping, compared with a flat apparatus. Further, such an apparatus may increase the responsivity of the photodetector (e.g. through achieving a higher external quantum efficiency, EQE) and increase the wavelength selectivity (e.g. through achieving a selective EQE) of the apparatus.

The texturing of the surface 312 may comprise one or more texture shapes and/or one or more texture dimensions. For example, a surface may be tuned for efficient absorption of a spectrum of incident visible light by texturing the surface with a range of surface undulation shapes/geometries and/or surface undulation dimensions to increase absorption of the visible light across the visible light wavelength range. In other words, the size and shape of texture may be adjusted to a target wavelength range for the photodetector to operate in.

A mixture of patterned features may be used to form a pixel array, each pixel having a particular surface texture and thus a particular sensitivity to a particular wavelength or wavelength range of electromagnetic radiation. For example, different wavelength sensitivity pixels may have different average peak amplitudes or peak separation for the texture of each pixel. In the example of a series of different-sensitivity pixels spaced across the surface of a detector, such a detector could be used in different camera modes by filtering out the light received by a particular sensitive pixel type, for example infra-red radiation sensitive or visible light sensitive pixels. Such a detector would allow for the (simple) deposition of a single type of quantum dot over the differently surface-textured pixels and therefore there would be no requirement to use different materials for pixels of different wavelength sensitivity.

Figure 3B:
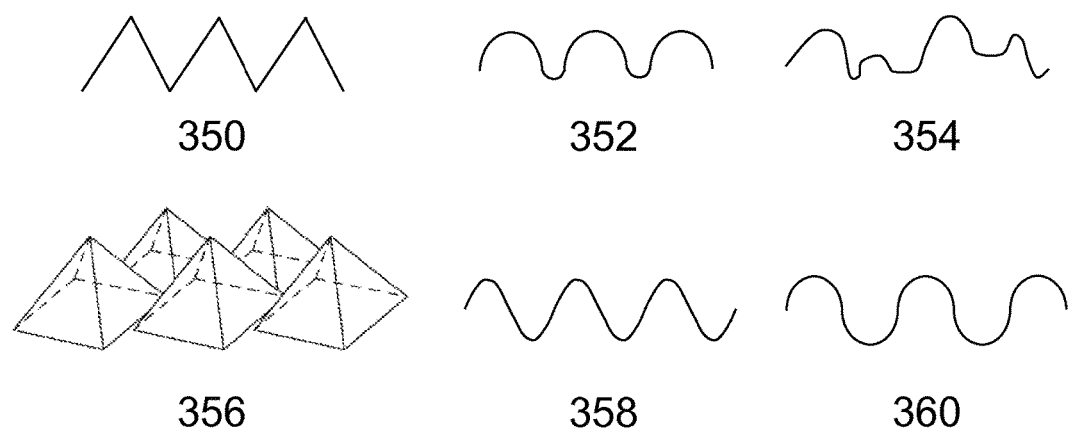
FIG. 3b illustrates possible surface roughness profiles of an apparatus according to examples described herein.

The undulations in the incident electromagnetic radiation surface may have one or more particular shapes as shown in FIG. 3b. For example, the undulations providing the surface texture may comprise one or more of: periodic undulations 350, 352, 356, 358, 360, rounded pyramidal undulations 358, pyramidal undulations 350, 356, U-shaped undulations 360, hemispherical undulations 352, and/or irregular undulations 354. Inverted texture shapes may also be used, for example inverted pyramid structures or other suitable inverted structures.

In an apparatus in which the two dimensional conductive channel (e.g., a graphene sheet) overlays a textured substrate such that the two dimensional conductive channel substantially conforms to the underlying substrate texturing, it may be advantageous to use an undulation shape without sharp corners to help preserve the integrity of the overlying two dimensional conductive channel and reduce the possibility of cracks forming in the two dimensional conductive channel due to a sudden change of underlying substrate direction (i.e. folding over a sharp corner). Therefore, for example, surface textures such as those shown in FIG. 3b with rounded corners 352, 354, 358, 360 may advantageously help the overlying two dimensional conductive channel to remain intact and avoid cracking/breaking.

While the flatness of the substrate (i.e. with a low surface roughness) is important for manufacturing devices having two dimensional conductive channels such as graphene channels, the introduction of "large scale" features (for example, between 50 nm and 1000 nm in size), in particular with a smooth profile (rather than angular corners) should not substantially affect the charge transport properties of the two dimensional conductive channel (e.g. graphene) layer. Furthermore, the texture of the polymer substrate may be smoothed by a variety of techniques, such as etching or nano-imprinting, if necessary for reducing nanoscale roughness (for example, to between 0.1 nm and 10 nm) and helping maintain the integrity of the two dimensional conductive channel layer.

FIGS. 4a and 4b illustrate example apparatuses which may be used as photodetectors. FIG. 4a illustrates a photodetector 400 comprising a two dimensional conductive channel 408 with source and drain electrodes 404 configured to enable a flow of electrical current through the two dimensional conductive channel 408; and a quantum dot layer 406 overlying the two dimensional conductive channel 408. The quantum dot layer 406 is configured to have an incident electromagnetic radiation surface which has a texturing comprising undulations in the surface to provide a surface roughness with an average peak amplitude of the order of between 10 nm and 300 nm. Also present in the example photodetector of FIG. 4a is a dielectric layer 410 (an insulator) underlying the two dimensional conductive channel 408, and a textured substrate 402 underlying the dielectric layer 410. The textured substrate 402 may comprise a polymer, for example. Polymer substrates may be advantageously used to provide a flexible apparatus 400.

FIG. 4b illustrates a field effect transistor (FET) 450 comprising a two dimensional conductive channel 408 with source and drain electrodes 404 configured to enable a flow of electrical current through the two dimensional conductive channel 408; and a quantum dot layer 406 overlying the two dimensional conductive channel 408. The quantum dot layer 406 is configured to have an incident electromagnetic radiation surface which has a texturing comprising undulations in the surface to provide a surface roughness with an average peak amplitude of the order of between 10 nm and 300 nm. Also present in the example FET of FIG. 4b is an insulating dielectric layer 410 underlying the two dimensional conductive channel 408, a gate electrode layer 412 underlying the dielectric layer 410, such that the two dimensional conductive channel 408 is located between the dielectric layer 410 and the quantum dot layer 406. Also present is a textured substrate 402 underlying the gate electrode layer 412. The gate electrode layer 412 in this example is a bottom gate, or back gate 412 (although other gate configurations can be used). Again the substrate 402 may comprise a polymer, allowing the fabrication of a flexible FET 450.

By providing a polymer substrate 402, mechanically flexible and optically transparent photodetectors and FETs may be advantageously fabricated on a large-area plastic foil at low cost. As trends in electronic device fabrication move towards using new form factors and mechanical flexibility and/or optical transparency, it may be advantageous to provide a solution such as this for reliable and productive light absorption and detection. In examples such as those described herein, comprising a quantum dot layer and a two-dimensional conductive channel, such as a graphene channel, it is advantageously possible to build ultrasensitive light sensors/photodetectors which are light-weight, flexible (for example, if fabricated on a polymer or other flexible substrate) and able to be fabricated as large-area devices.

Figure 5:
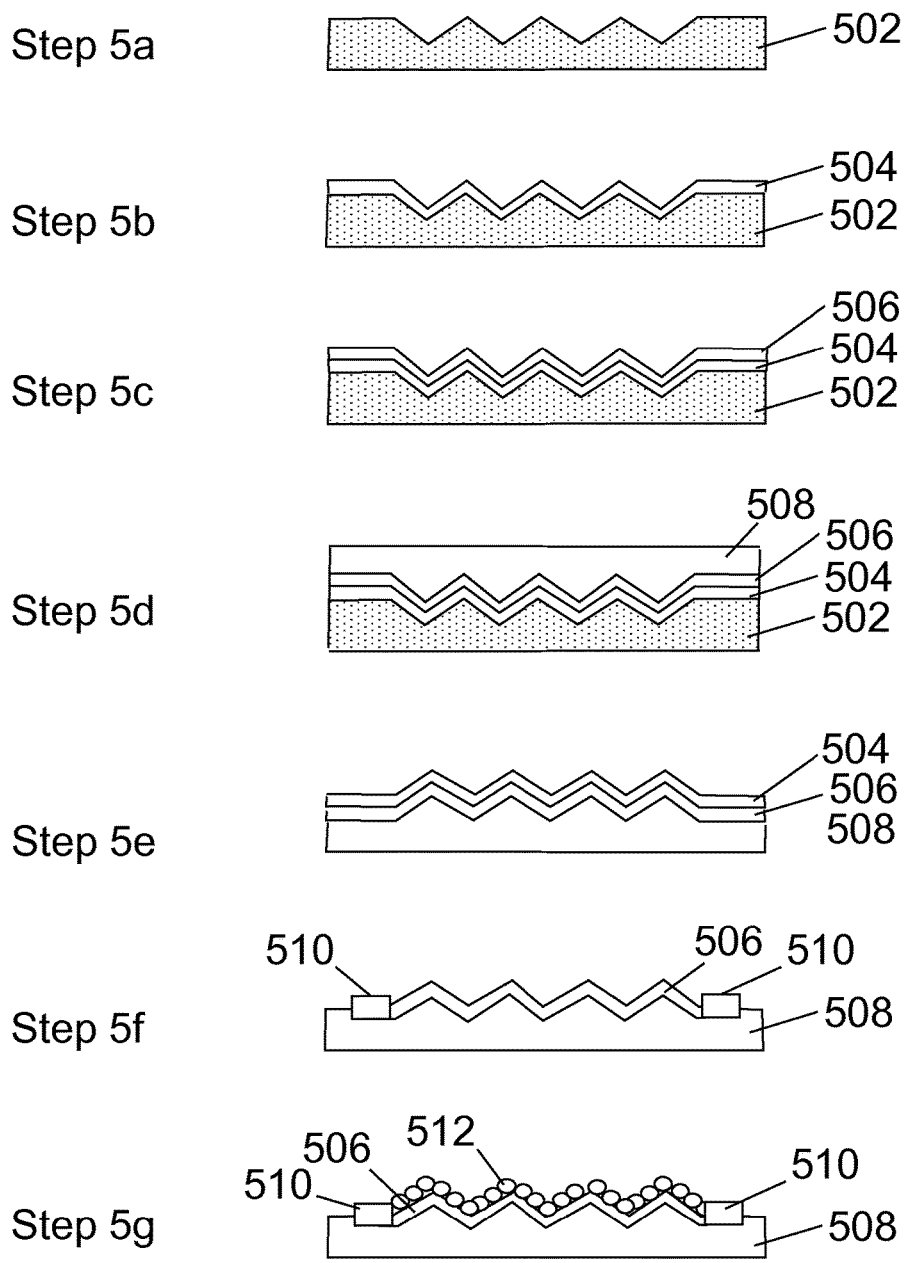
FIG. 5 illustrates a method of making an apparatus according to examples described herein.

FIG. 5 illustrates an example method of manufacture of a photodetector. This method may be termed a "polymer on graphene" method (if graphene is used as a two dimensional conductive channel and a polymer substrate is used).

Overall this method comprises texturing a substrate surface 502; depositing by direct growth the two dimensional conductive channel 506 over the textured substrate surface 502 so that it conforms to the underlying textured substrate surface 502 to provide a two dimensional textured conductive channel surface 506 having texturing comprising undulations in the surface; and depositing a layer of quantum dots 512 on the textured two dimensional conductive channel 506 such that the quantum dot layer 512 conforms to the textured surface to provide the surface roughness with an average peak amplitude of the order of between 10 nm and 300 nm.

In Step 5a, a textured donor substrate 502 is used. The donor substrate 502 may comprise, for example, silicon (Si) and/or silicon dioxide ($SiO_x$). By using a donor substrate 502 having a $SiO_x$ layer on a Si base, the donor substrate 502 may be removed after fabrication of the apparatus by the $SiO_x$ acting as a release layer. The substrate 502 may be textured using etching or any other suitable method. Thus Step 5a shows the provision of a sacrificial substrate layer 502 having a textured sacrificial substrate surface.

In Step 5b a metallic seed layer 504 is deposited onto the textured substrate 502 so that it conforms to the textured substrate 502. The metallic seed layer may comprise, for example, a metal such as copper, nickel, tungsten, rhenium, or other transition metals or their alloys. Thus Step 5b shows the deposition of a metallic seed layer 504 onto the textured substrate 502 so that it conforms to the textured substrate 502.

In Step 5c the two dimensional conductive channel 506 is deposited onto the textured metallic seed layer 504 using chemical vapour deposition (CVD) so that it conforms to the underlying textured metallic seed layer 504 to provide the surface roughness to the incident electromagnetic radiation surface of the resulting apparatus. Indirectly, the two dimensional conductive channel 506 is deposited on the textured sacrificial substrate surface 502 (with an intervening metallic seed layer 504 in this example) so that it conforms to the textured sacrificial substrate surface 502, because the intervening metallic seed layer 504 also conforms to the textured sacrificial substrate surface 502.

The CVD growth of the two dimensional conductive channel 506 on the textured metallic seed layer 504 may be achieved by careful selection of CVD growth parameters such as a growth temperature window, selected in order to achieve a continuous monolayer 506. Thus in this example the two dimensional conductive channel 506 is textured by growing the layer 506 itself on a textured (sacrificial) substrate 502, 504.

As an example, the graphene CVD deposition process may involve high temperatures up to 1000 C. The polymer substrate deposited on graphene can be either hardened by UV light or thermally at relatively low temperatures typically below 150 C. Any photolithography steps may involve the use of short temperature exposures up to 120 C.

In some examples (not shown here) a thin dielectric layer (for example, $AlO_x$, $SiN_x$) can be deposited on top of the two dimensional conductive channel 506 in order to tune the graphene interface property for reducing the number of charge impurities or inhomogeneities and thus improving charge carrier transport in the graphene layer. Furthermore, a thin dielectric layer along with a gate layer can be used for providing a FET structure.

In Step 5d, a polymer layer 508 is cast/deposited against the two dimensional conductive channel layer 506 to form a shaped acceptor substrate 508. Once the stack of metallic seed layer 504, two dimensional conductive channel layer 506 and polymer acceptor substrate 508 is released from the donor substrate 502 by etching away the $SiO_x$ layer as shown in Step 5e, the electrodes 510 can be subsequently deposited or patterned from a metal catalyst layer as shown in Step 5f. In other words, the method shown in FIG. 5 comprises releasing the sacrificial substrate layer 502 to expose (after etching away the metallic seed layer 504) the two dimensional conductive channel 506 having texturing comprising undulations in the surface to provide the surface roughness to the incident electromagnetic radiation surface.

After the deposition of electrodes 510, quantum dots 512, and/or other functional layer(s) if required, can be coated or printed over the textured two dimensional conductive channel layer 506. In some examples, as shown in Step 5g, the quantum dot layer 512 may form a conformal coating with uniform thickness, i.e. where the quantum dot layer 512 conforms to the texture of the underlying two dimensional conductive channel layer 506.

In other examples, a "double texture" may be introduced, for example by depositing a variable thickness quantum dot layer 512. Such a "double texture" apparatus may be used for wider light spectrum harvesting (that is, by having an incident electromagnetic radiation surface with two textures, one from the underlying textured two dimensional conductive channel 506 and a second texture form the quantum dot layer 512 itself, a broader range of electromagnetic radiation wavelengths may be absorbed by the device). For example, a solution-processed quantum dot layer 512 may be deposited on top of a textured two dimensional conductive channel layer 506 such that the quantum dot layer 512 adds an extra roughness/texture with (for example) a smaller periodicity than the two dimensional conductive channel layer 506 texture. The smaller quantum dot layer 512 texture periodicity may be beneficial for absorption of shorter wavelength electromagnetic radiation, thereby providing a double texture broadening absorption spectrum.

In another examples, a bottom gate electrode and a gate dielectric may be included between the two dimensional conductive channel 506 and the polymer acceptor substrate 508 in order to complete a FET structure (as described above in relation to FIG. 4b).

Figure 6:
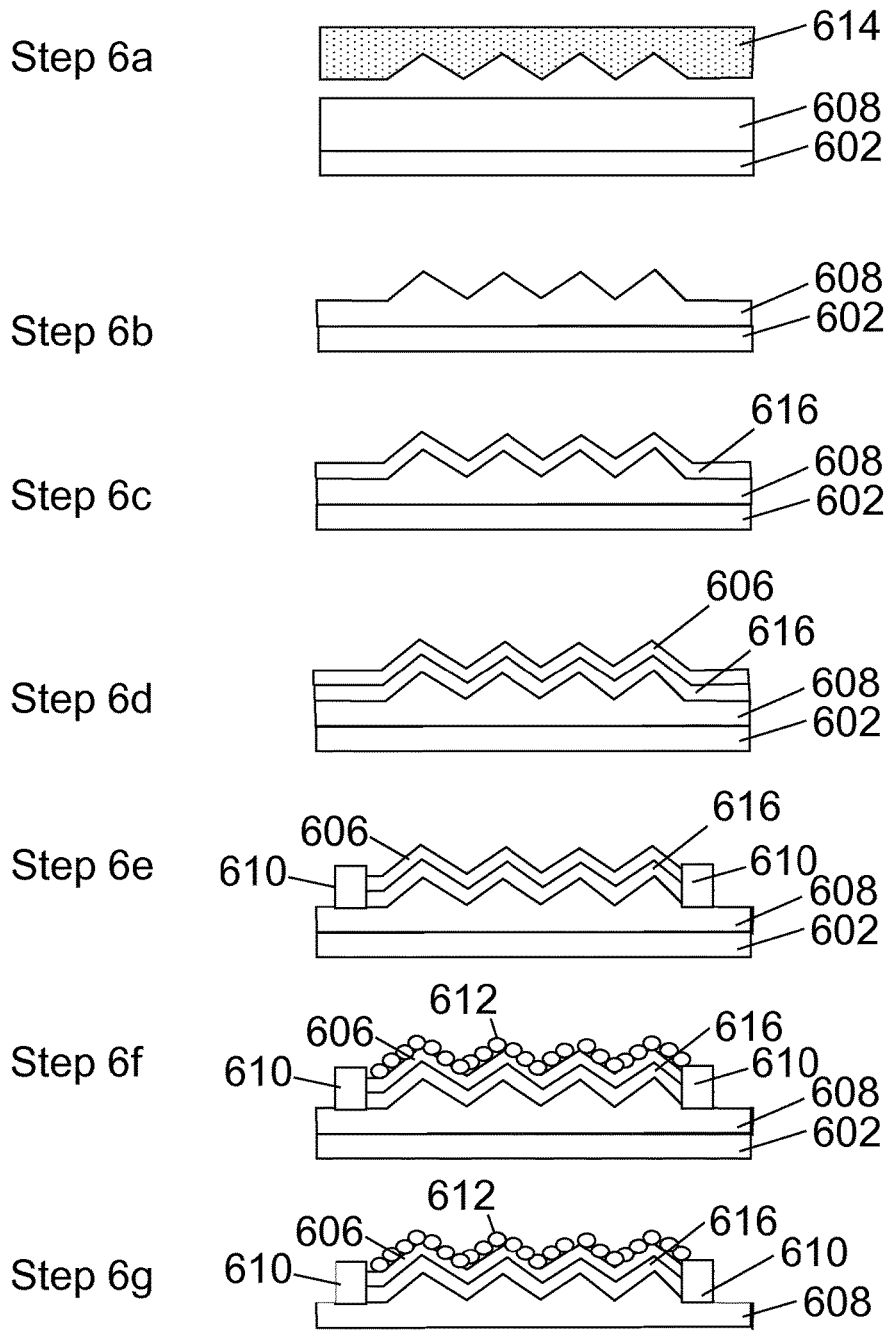
FIG. 6 illustrates another method of making an apparatus to examples described herein.

FIG. 6 illustrates another example method of manufacture of a photodetector. This method may be termed a "direct deposition" method because the two dimensional conductive channel layer is deposited directly (e.g. transferred as a layer) onto the textured substrate (and any intervening layers such as dielectric layers, if used) without sacrificing a textured substrate and/or metallic seed layer as described in relation to FIG. 5.

Step 6a shows a base substrate 602 onto which a liquid substrate polymer layer 608 is deposited. A master mould 614 is then used to imprint a texture into the liquid substrate polymer layer 608 resulting in a textured substrate polymer layer 608 after the polymer layer is solidified (for example, by curing, setting, or otherwise drying out/solidifying). The textured substrate polymer layer 608 is shown in Step 6b. Therefore these steps 6a and 6b show texturing of the underlying substrate surface 608, wherein the substrate 608 comprises a polymer; and the substrate surface 608 is textured by depositing the substrate as a liquid and imprinting the liquid substrate with a mould 614 to form the textured substrate surface 608.

In other examples, texturing the polymer layer 608 can be done by, for example, UV nanoimprinting or hot embossing. Such techniques to shape/texture the polymer substrate 608 may be performed before or after the process of applying the two dimensional conductive channel layer 606.

In Step 6c a thin dielectric layer 616 (for example, $AlO_x$, $SiN_x$) is deposited over the polymer substrate layer 608 before transferring the two dimensional conductive channel 606. The dielectric layer 616 may help reduce any effects of two dimensional conductive channel 506-polymer 508 interfacing. A similar step may be performed between Step 5c and Step 5d of the previous example in FIG. 5. The dielectric layer 616 conforms to the underlying textured polymer substrate 602 to provide a textured surface.

In Step 6d the two dimensional conductive channel layer 606 (e.g., a graphene sheet) is transferred onto the textured dielectric layer 616. In the case of using graphene for the layer 616, transfer using a wet method (PMMA based or other suitable solvent based) may be performed to deposit the two dimensional conductive channel layer (the graphene layer) 606. Provided the underlying texturing is suitably smooth (see examples shown in FIG. 3b) and the undulations are of a suitable size (for example, having a lateral size of between approximately 50 nm and 2000 nm, and having an average peak amplitude/height of below 1000 nm, for example between 10 nm and 300 nm), the two dimensional conductive channel layer 606 may be applied such that it conforms to the texture of the underlying substrate 608, 616 without areas being "suspended" (i.e. not conforming) and without significant breakage of the layer 606. In other words, Step 6d shows deposition of the two dimensional conductive channel 606 over the textured substrate surface 608, 616 so that it conforms to the underlying textured substrate surface 608, 616 to provide a two dimensional textured conductive channel surface 606 having texturing comprising undulations in the surface.

In some examples (not shown) a gate layer, then a dielectric layer may be deposited before depositing the two dimensional conductive channel 606, such that the two dimensional conductive channel 606 is located between the dielectric layer and the quantum dot layer 612 and the resulting apparatus may be used as a FET.

Step 6e shows electrodes (e.g., source and drain electrodes) 610 being deposited. Step 6f shown the deposition of the quantum dot layer 612, conforming to the underlying textured two dimensional conductive channel layer 606. In other words, Step 6f shows deposition of a layer of quantum dots 612 on the textured two dimensional conductive channel 606 such that the quantum dot layer 612 conforms to the textured surface to provide the surface roughness with an average peak amplitude of the order of between 10 nm and 300 nm.

In Step 6g, the initial substrate 602 used to support the initially liquid polymer 608 is removed.

With regard to some typical processing parameters in certain embodiments, the polymer substrate deposited on graphene can be either hardened by UV light or thermally at relatively low temperatures typically below 150 C. The photolithography steps may involve the use of short temperature exposures up to 120 C. The dielectric deposition and patterning may also involve temperatures up to 120 C.

Figure 7:
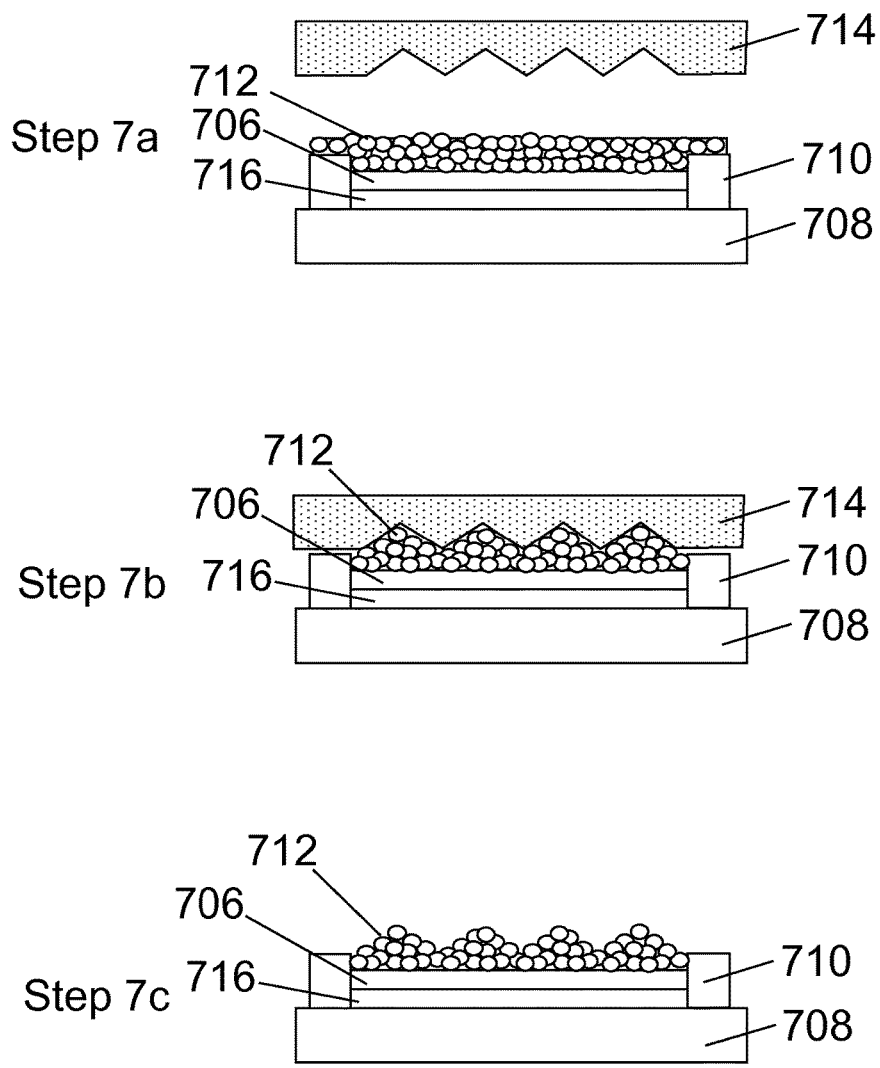
FIG. 7 illustrates another method of making an apparatus to examples described herein.

FIG. 7 illustrates a further example method which differs from those described in relation to FIGS. 5 and 6 in that the quantum dot layer itself 712 comprises the surface roughness such that the incident electromagnetic radiation surface is independent of any underlying surface texture provided to the two dimensional conductive channel 706. That is, the quantum dot layer 712 is textured by having varying thickness, whereas the underlying substrate 706, 708, 716 is flat (i.e. planar, non-textured). Of course as mentioned above, "double textured" apparatus may be fabricated in which both the underlying substrate is textured, as well as the quantum dot layer itself being textured (i.e. having a variable thickness over its area).

Step 7a shows the quantum dot layer 712 being provided by deposition of the quantum dot layer as a wet layer 712, in this example onto a two dimensional conductive channel 706 which is in turn on top of a dielectric layer 716 on a polymer substrate 708. In this example the electrodes 710 are in place prior to the texturing of the quantum dot layer 712, but in other example may be deposited/provided after the quantum dot layer 712 has been textured.

Step 7b shows imprinting of the wet quantum dot layer 712 with a textured mould 714 to provide the incident electromagnetic radiation surface with the surface roughness so that the quantum dot layer itself 712 comprises the surface roughness. The resulting apparatus is shown in Step 7c. Such a configuration may be less complex than exampled described above in which the two dimensional conductive channel itself is textured. Further, such a configuration may reduce the possibility of unwanted surface roughness at an interface between a dielectric layer (if present) and the two dimensional conductive channel 706.

In some examples the quantum dot layer 712 may have a variable thickness as shown, providing the surface roughness with an average peak amplitude of the order of between 10 nm and 300 nm. In some examples the quantum dot layer 712 may have a variable thickness providing the surface roughness with an average peak separation of the order of between 50 nm and 2000 nm. In some examples the quantum dot layer 712 may have a layer thickness of the order of between 10 nm and 500 nm. The quantum dot layer 712 may have a layer thickness of the order of approximately 100 nm. The responsivity of the photodetector may be dependent on the thickness of the quantum dot layer 712.

Using flexible two dimensional conductive channel layers, such as graphene, and polymer materials capable of being shaped in different ways as substrates, makes it possible to fabricate photodetectors having precisely adjusted surface textures in order to increase light absorption in a particular part of the electromagnetic spectrum.

Advantages of apparatus described herein, in particular over devices having a planar surface without surface texturing, include increased light absorption. By using surface texturing, photodetectors as described herein may have increased responsivity (by trapping more light than an equivalent planar photodetector) and improved selectivity (by tuning the properties of the detector, such as choosing a particular undulation peak amplitude, undulation peak separation, quantum dot material). Local wavelength selectivity and amplification via texturing of the underlying two dimensional conductive channel may enable detectors to be made with different functions using the same broadband quantum dots.

It is possible to fabricate quantum dot/two dimensional conductor devices/apparatus as described herein using affordable methods of shaping polymers in different geometries. Overall, fabrication may be low cost, fast and involve low temperature processing if thermoset and UV curing polymers are used for substrate materials. Manufacture may be performed on large-area plastic/polymer foils/sheets at low cost. The devices may be made with mechanical flexibility and optical transparency (if using a transparent flexible polymer substrate and a flexible two dimensional conductive channel layer, such as graphene). The apparatus described herein may be used as visible light/infra-red light sensors or as X-ray detectors, for example.

Figure 8:
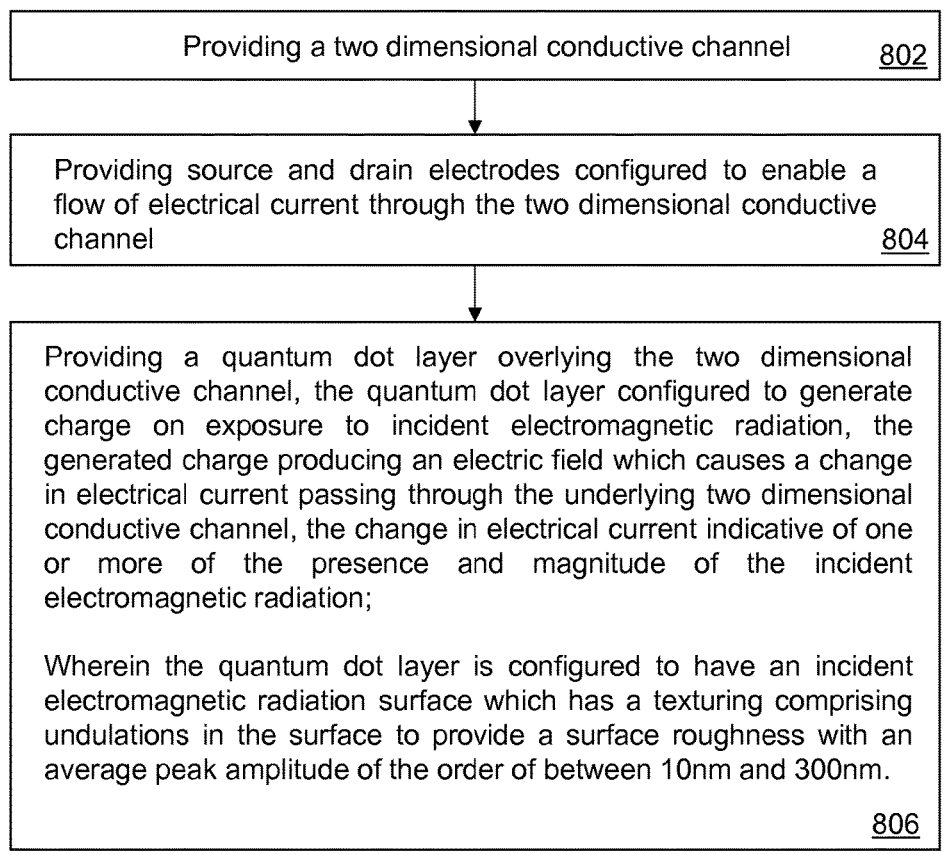
FIG. 8 illustrates schematically a method of making an apparatus according to examples disclosed herein.

FIG. 8 shows the main steps 802, 804, 806 of a method of making the present apparatus. The method generally providing a two dimensional conductive channel 802; providing source and drain electrodes configured to enable a flow of electrical current through the two dimensional conductive channel 804; and providing a quantum dot layer overlying the two dimensional conductive channel 806, the quantum dot layer configured to generate charge on exposure to incident electromagnetic radiation, the generated charge producing an electric field which causes a change in electrical current passing through the underlying two dimensional conductive channel, the change in electrical current indicative of one or more of the presence and magnitude of the incident electromagnetic radiation; wherein the quantum dot layer is configured to have an incident electromagnetic radiation surface which has a texturing comprising undulations in the surface to provide a surface roughness with an average peak amplitude of the order of between 10 nm and 300 nm.

Figure 9:
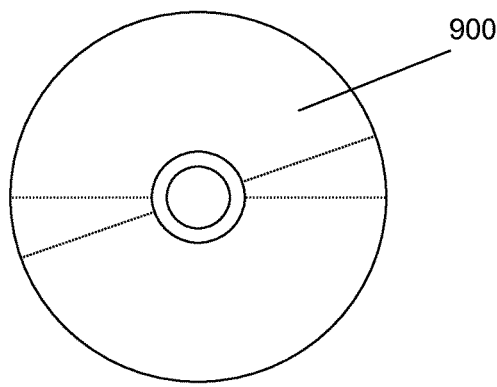
FIG. 9 shows a computer-readable medium comprising a computer program configured to perform, control or enable the method of FIG. 8.

FIG. 9 illustrates schematically a computer/processor readable medium 900 providing a computer program according to one embodiment. The computer program comprises computer code configured to perform, control or enable one or more of the method steps of FIG. 8. In this example, the computer/processor readable medium 900 is a disc such as a digital versatile disc (DVD) or a compact disc (CD). In other embodiments, the computer/processor readable medium 900 may be any medium that has been programmed in such a way as to carry out an inventive function. The computer/processor readable medium 900 may be a removable memory device such as a memory stick or memory card (SD, mini SD, micro SD or nano SD).

It will be appreciated to the skilled reader that any mentioned apparatus/device and/or other features of particular mentioned apparatus/device may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some embodiments, a particular mentioned apparatus/device may be pre-programmed with the appropriate software to carry out desired operations, and wherein the appropriate software can be enabled for use by a user downloading a "key", for example, to unlock/enable the software and its associated functionality. Advantages associated with such embodiments can include a reduced requirement to download data when further functionality is required for a device, and this can be useful in examples where a device is perceived to have sufficient capacity to store such pre-programmed software for functionality that may not be enabled by a user.

It will be appreciated that any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

It will be appreciated that any "computer" described herein can comprise a collection of one or more individual processors/processing elements that may or may not be located on the same circuit board, or the same region/position of a circuit board or even the same device. In some embodiments one or more of any mentioned processors may be distributed over a plurality of devices. The same or different processor/processing elements may perform one or more functions described herein.

It will be appreciated that the term "signalling" may refer to one or more signals transmitted as a series of transmitted and/or received signals. The series of signals may comprise one, two, three, four or even more individual signal components or distinct signals to make up said signalling. Some or all of these individual signals may be transmitted/received simultaneously, in sequence, and/or such that they temporally overlap one another.

With reference to any discussion of any mentioned computer and/or processor and memory (e.g. including ROM, CD-ROM etc), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/embodiments may consist of any such individual feature or combination of features. In view of the foregoing description it will be evident to a person skilled in the art that various modifications may be made within the scope of the disclosure.

While there have been shown and described and pointed out fundamental novel features as applied to different embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment may be incorporated in any other disclosed or described or suggested form or embodiment as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. An apparatus comprising:
a conductive channel with source and drain electrodes configured to enable a flow of electrical current through the conductive channel; and
a quantum dot layer overlying the conductive channel, the quantum dot layer configured to generate charge on exposure to incident electromagnetic radiation, the generated charge producing an electric field which causes a change in electrical current passing through the underlying conductive channel, the change in electrical current indicative of one or more of the presence and magnitude of the incident electromagnetic radiation;
wherein the quantum dot layer is configured to have an incident electromagnetic radiation surface, opposite a surface in contact with the conductive channel, which has a texturing comprising undulations in the surface to provide a surface roughness with an average peak amplitude of the order of between 10 nm and 300 nm.

2. The apparatus of claim 1, wherein the quantum dot layer is configured to have an incident electromagnetic radiation surface which has a texturing comprising undulations in the surface to provide a surface roughness with an average peak separation of the order of between 50 nm and 2000 nm.

3. The apparatus of claim 1, wherein the quantum dot layer is configured to have an incident electromagnetic radiation surface which has a texturing comprising undulations in the surface to provide a surface roughness with an average peak separation of the order of between 50 nm and 800 nm.

4. The apparatus of claim 1, wherein the surface roughness is provided by one or more of:
the quantum dot layer conforming to an underlying surface texture provided to the conductive channel; and
the quantum dot layer comprising the surface roughness such that the incident electromagnetic radiation surface is at least independent of any underlying surface texture provided to the conductive channel.

5. The apparatus of claim 1, wherein the surface roughness is provided by one or more of:
the quantum dot layer having a variable thickness providing the surface roughness with an average peak amplitude of the order of between 10 nm and 300 nm; and
the underlying surface texture provided to the conductive channel providing the surface roughness with an average peak amplitude of the order of between 10 nm and 300 nm.

6. The apparatus of claim 1, wherein the surface roughness is provided by one or more of:
the quantum dot layer having a variable thickness providing the surface roughness with an average peak separation of the order of between 50 nm and 2000 nm; and
the underlying surface texture provided to the conductive channel providing the surface roughness with an average peak separation of the order of between 50 nm and 2000 nm.

7. The apparatus of claim 1, wherein the quantum dot layer has a thickness of between about 10 nm and 500 nm.

8. The apparatus of claim 1, wherein the quantum dot layer is deposited from colloidal quantum dots, or wherein the quantum dot layer comprises colloidal quantum dots.

9. The apparatus of claim 1, wherein the conductive channel comprises graphene.

10. The apparatus of claim 1, wherein the undulations in the surface of the quantum dot layer comprise one or more of: periodic undulations, rounded pyramidal undulations, pyramidal undulations, U-shaped undulations, hemispherical undulations, and irregular undulations.

11. The apparatus of claim 1, further comprising:
a dielectric layer underlying the conductive channel; and
a gate layer underlying the dielectric layer, such that
the conductive channel is located between the dielectric layer and the quantum dot layer.

12. A method comprising:
providing a conductive channel;
providing source and drain electrodes configured to enable a flow of electrical current through the conductive channel; and
providing a quantum dot layer overlying the conductive channel, the quantum dot layer configured to generate charge on exposure to incident electromagnetic radiation, the generated charge producing an electric field which causes a change in electrical current passing through the underlying conductive channel, the change in electrical current indicative of one or more of the presence and magnitude of the incident electromagnetic radiation;
wherein the quantum dot layer is configured to have an incident electromagnetic radiation surface opposite a surface in contact with the conductive channel, which has a texturing comprising undulations in the surface to provide a surface roughness with an average peak amplitude of the order of between 10 nm and 300 nm.

13. The method of claim 12, wherein providing the quantum dot layer comprises one or more of:
depositing a layer of quantum dots so that it conforms with an underlying surface texture provided to the conductive channel; and
depositing a layer of quantum dots such that the layer of quantum dots has the surface roughness such that the incident electromagnetic radiation surface is at least independent of any underlying surface texture provided to the conductive channel.

14. The method of claim 12, wherein providing the quantum dot layer comprises depositing the quantum dot layer as a wet layer, and imprinting the wet quantum dot layer with a textured mould to provide the incident electromagnetic radiation surface with the surface roughness so that the quantum dot layer comprises the surface roughness.

15. The method of claim 14 wherein a face of the mould engages with the wet layer, the face of the mould having a textured surface with an average peak amplitude of the order of between 10 nm and 300 nm.

16. The method of claim 12, wherein the method comprises:
texturing a substrate surface;
depositing the conductive channel over the textured substrate surface so that it conforms to the underlying textured substrate surface to provide a textured conductive channel surface having texturing comprising undulations in the surface; and
depositing a layer of quantum dots on the textured conductive channel such that the quantum dot layer conforms to the textured surface to provide the surface roughness with an average peak amplitude of the order of between 10 nm and 300 nm.

17. The method of claim 16, wherein:
the substrate comprises a polymer; and
the substrate surface is textured by depositing the substrate as a liquid and imprinting the liquid substrate with a mould to form the textured substrate surface.

18. The method of claim 16, wherein the method comprises:
depositing a metallic seed layer onto the textured substrate so that it conforms to the textured substrate; and
depositing the conductive channel onto the textured metallic seed layer using chemical vapour deposition so that it conforms to the underlying textured metallic seed layer to provide the surface roughness to the incident electromagnetic radiation surface.

19. The method of claim 12, wherein the method comprises:
providing a sacrificial substrate layer having a textured sacrificial substrate surface;
depositing the conductive channel on the textured sacrificial substrate surface so that it conforms to the textured sacrificial substrate surface;
depositing a polymer layer onto the conductive channel; and
releasing the sacrificial substrate layer to expose the conductive channel having texturing comprising undulations in the surface to provide the surface roughness to the incident electromagnetic radiation surface.

* * * * *